United States Patent
Kanasugi et al.

(10) Patent No.: US 7,051,059 B2
(45) Date of Patent: May 23, 2006

(54) OVERSAMPLING FIR FILTER, METHOD FOR CONTROLLING THE SAME, SEMICONDUCTOR INTEGRATED CIRCUIT HAVING THE SAME, AND COMMUNICATION SYSTEM FOR TRANSMITTING DATA FILTERED BY THE SAME

(75) Inventors: Masami Kanasugi, Kawasaki (JP);
Shoji Taniguchi, Kawasaki (JP);
Koichi Kuroiwa, Kawasaki (JP);
Mahiro Hikita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 451 days.

(21) Appl. No.: 09/818,350

(22) Filed: Mar. 27, 2001

(65) Prior Publication Data

US 2002/0023115 A1    Feb. 21, 2002

(30) Foreign Application Priority Data

Aug. 16, 2000   (JP)   ............................... 2000-246992

(51) Int. Cl.
*G06F 17/17* (2006.01)

(52) U.S. Cl. ..................................... 708/313

(58) Field of Classification Search ................ 708/523, 708/503, 620–632, 300–323; 341/123; 375/229
See application file for complete search history.

(56) References Cited

U.S. PATENT DOCUMENTS

| | | | | |
|---|---|---|---|---|
| 4,990,911 A | * | 2/1991 | Fujita et al. ................. | 341/123 |
| 5,311,459 A | * | 5/1994 | D'Luna et al. ............. | 708/607 |
| 5,528,527 A | * | 6/1996 | Iwata et al. ................. | 708/316 |
| 5,608,824 A | * | 3/1997 | Shimizu et al. ............. | 382/276 |
| 5,793,656 A | * | 8/1998 | Richmond et al. .......... | 708/230 |
| 5,838,725 A | * | 11/1998 | Gurusami et al. .......... | 375/229 |
| 5,928,313 A | * | 7/1999 | Thompson ................... | 708/313 |
| 6,032,171 A | * | 2/2000 | Kiriaki et al. .............. | 708/316 |
| 6,421,379 B1 | * | 7/2002 | Vannatta et al. ............ | 375/229 |
| 6,591,283 B1 | * | 7/2003 | Conway et al. ............. | 708/316 |
| 6,889,239 B1 | * | 5/2005 | Akahori ...................... | 708/313 |

FOREIGN PATENT DOCUMENTS

| | | |
|---|---|---|
| EP | 0 336 669 | 10/1989 |
| EP | 0 633 535 | 1/1995 |
| JP | 06-152330 | 5/1994 |
| WO | WO 00/03510 | 1/2000 |

OTHER PUBLICATIONS

European Search Report received Dec. 24, 2004.

* cited by examiner

*Primary Examiner*—Kakali Chaki
*Assistant Examiner*—Chat C. Do
(74) *Attorney, Agent, or Firm*—Katten Muchin Rosenman LLP

(57) ABSTRACT

When changing the number of oversamples is performed, tap factors selected by selectors, which respectively correspond to holding parts in a shift register, are changed back to a predetermined number of tap factors used before the changing of the number of oversamples, in which every time input data is accepted, the changes of the tap factors are performed in sequence, starting from the selector corresponding to the holding part at the input side. This allows the individual selectors to select proper tap factors according to the input data after the changing of the number of oversamples. As a result, the continuity of the output data is maintained even before and after the number of oversamples is changed.

10 Claims, 13 Drawing Sheets

OVERSAMPLING FIR FILTER, METHOD FOR CONTROLLING THE SAME, SEMICONDUCTOR INTEGRATED CIRCUIT HAVING THE SAME, AND COMMUNICATION SYSTEM FOR TRANSMITTING DATA FILTERED BY THE SAME

BACKGROUND OF THE INVENTION

1. Field of the Invention

The present invention relates to an oversampling FIR filter for use in a portable terminal, etc. of a mobile communication system.

2. Description of the Related Art

FIR (Finite Impulse Response) filters have such linear phase characteristics, transfer functions, and stability that analog filters cannot achieve, and thus are put into a variety of uses including communication apparatuses and audio apparatuses. In particular, FIR filters are effectively applied to the filters on CDMA (Code Division Multiple Access) and other digital mobile communication methods. For stabilization of filter rejection regions, FIR filters of oversampling type have become dominant.

Among the oversampling FIR filters of this type is, for example, the one disclosed in Japanese Unexamined Patent Application Publication No. Hei8-37444.

The oversampling FIR filter disclosed in the publication includes: a shift register having a plurality of delay elements for holding input data; a factor selector; and an adder. The factor selector generates predetermined tap factors in accordance with the output values from the delay elements of the shift register and a timing signal. The adder obtains the sum of the plurality of tap factors output from the factor selector.

In an oversampling FIR filter configured as described above, the shift register need not be provided with as many delay elements as the number corresponding to the number of oversamples of the input data. This reduces the adder in scale, allowing a simpler hardware configuration as compared with ordinary oversampling FIR filters. Incidentally, in the following description, an oversampling FIR filter of this type will be also referred to as an oversampling FIR filter of tap switching type.

In the CDMA method, a portable terminate diffuses its to-transmit signals with diffusion codes and output the diffused data toward a base station. Here, for the sake of phase adjustment of data received at the base station, the portable terminal needs to change the number of oversamples in its FIR filter depending on the distances between the portable terminal and the base station. The above-mentioned FIR filter of tap switching type does not have as many delay elements as the number corresponding to the number of oversamples of input data. The number of oversamples signifies the number of times oversampling is performed. Accordingly, a change in the number of oversamples has caused a problem of discontinuity in output response. Thus, it has been impossible for FIR filters of tap switching type to be used for portable terminals in the CDMA method with varying the number of oversamples. Meanwhile, oversampling FIR filters having as many delay elements as the number of oversamples are greater in circuit scale as compared with the oversampling FIR filters of tap switching type. However, the number of zero data to be added to input data can be changed in accordance with the number of oversamples, thereby achieving the continuity in output response.

SUMMARY OF THE INVENTION

An object of the present invention is to provide an oversampling FIR filter of tap switching type in which the continuity of filter output responses is maintained even when the number of oversampling is performed is changed while the filter is in operation.

Another object of the present invention is to reduce the circuit scale of an oversampling FIR filter.

According to one of the aspects of the present invention, a shift register having a plurality of holding parts connected in cascade in the FIR filter, accepts input data and shifts the accepted data in sequence to be output from the individual holding parts. A plurality of selectors formed corresponding to the respective holding parts sequentially select, from a plurality of tap factors, a predetermined number of tap factors in synchronization with a clock. The number of oversamples is the number of tap factors to be multiplied during a cycle of input data variation. In other words, the number of oversamples is the number of tap factors to be selected for data by each selector. Multipliers respectively multiply the input data held in the holding parts by the tap factors selected by the selectors corresponding to the holding parts. The multiplication results are added by an adder to be output as output data.

The oversampling FIR filter is capable of maintaining the continuity of output data by changing tap factors to be selected by the selectors in accordance with a change in the number of oversamples. Conventionally, a number of holding parts corresponding to the number of oversamples are required to be provided in order to maintain the continuity of output data. In the present invention, it is not necessary to provide as many holding parts as the corresponding number of times oversampling is performed so that the oversampling FIR filter can be reduced in circuit scale.

According to another aspect of the present invention, a part of the plurality of tap factors selectable by the selectors is/are shared by the selectors. Therefore, even in the cases where the tap factors to be selected by the selectors are changed in accordance with a change in the number of oversamples, it is able to secure the tap factors to be multiplied by the input data with the whole selectors. As a result, the continuity of output data is maintained.

According to another aspect of the present invention, the selectors are instructed the tap factor to be selected first after the acceptance of input data, in accordance with a change in the number of oversamples. The instruction is exercised by a tap controlling unit inside the filter, a tap controlling unit outside the filter or software. The selectors have only to select tap factors according to the instruction. This simplifies the control mechanism. This consequently allows high speed filtering operations. Moreover, the application of the present invention avoids a rise in cost due to the simplified control mechanism.

According to another aspect of the present invention, when the number of oversamples is changed, the number of the tap factors to be selected by the selectors is changed back to the predetermined number of tap factors used before changing the number of oversamples. More specifically, every time input data is accepted, the changing of the number of tap factors are performed in sequence, starting from the selector corresponding to the holding part at the input side. Therefore, each of the selectors can select proper tap factors according to the input data after the change of the number of oversamples. This results in maintaining the continuity of output data before and after the change of the number of oversamples.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the embodiments of the present invention will be described with reference to the drawings.

Figure 1:
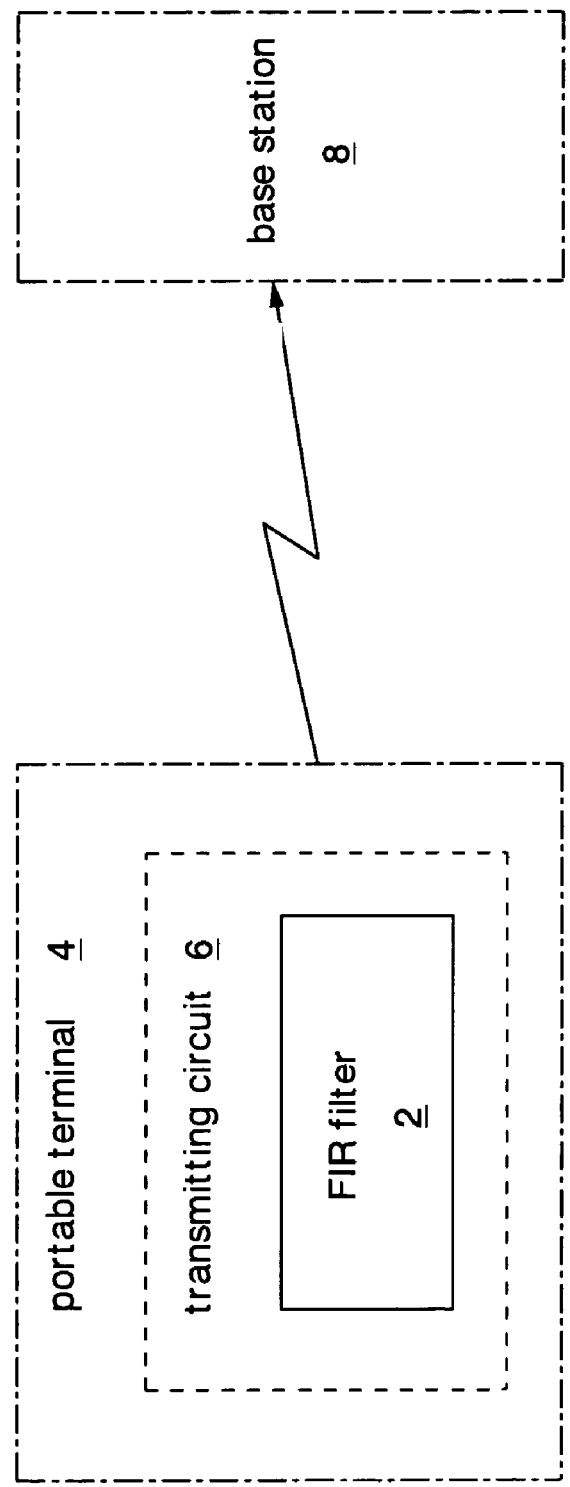
FIG. 1 is a block diagram showing a first embodiment of the present invention.

FIG. 1 shows a first embodiment of the oversampling FIR filter, the method for controlling the oversampling FIR filter, the semiconductor integrated circuit having the oversampling FIR filter, and the communication system for transmitting data filtered by the oversampling FIR filter.

An oversampling FIR filter 2 is used, for example, in a transmitting circuit 6 of a portable terminal 4 in a CDMA or W-CDMA (Wideband-CDMA) communication system. The transmitting circuit 6 is formed in a single chip by integrating CMOS transistors and the like on a Si substrate by using semiconductor manufacturing technologies. Signals transmitted from the portable terminal 4 are received at a base station 8.

Figure 2:
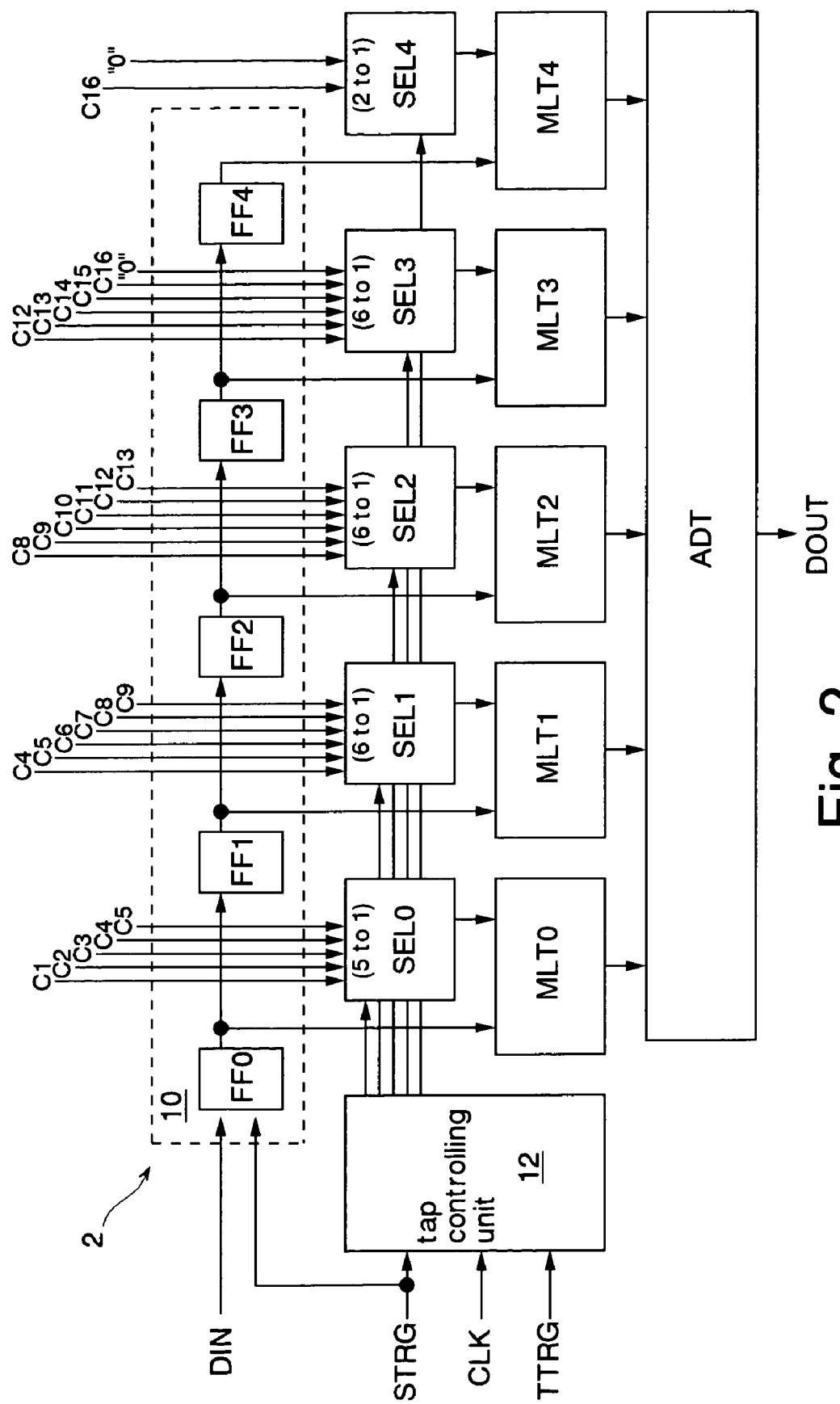
FIG. 2 is a block diagram showing the details of an FIR filter in FIG. 1.

FIG. 2 shows the details of the oversampling FIR filter 2.

The oversampling FIR filter 2 includes: a shift register 10 having flip-flops FF0, FF1, FF2, FF3, and FF4 for holding input data, connected in series from the input side; selectors SEL0, SEL1, SEL2, SEL3, and SEL4 and multipliers MLT0, MLT1, MLT2, MLT3, and MLT4 formed corresponding to the flip-flops FF0–FF4, respectively; an adder ADT; and a tap controlling unit 12.

The shift register 10 receives input data DIN at the flip-flop FF0 on the initial stage, and shifts the received data to the output side sequentially in synchronization with a sampling trigger signal STRG. The selector SEL0 receives tap factors C1, C2, C3, C4, and C5, and sequentially selects and outputs any of the tap factors according to control signals from the tap controlling unit 12. The selector SEL1 receives tap factors C4, C5, C6, C7, C8, and C9, and sequentially selects and outputs any of the tap factors according to control signals from the tap controlling unit 12. The selector SEL2 receives tap factors C8, C9, C10, C11, C12, and C13, and sequentially selects and outputs any of the tap factors according to control signals from the tap controlling unit 12. The selector SEL3 receives tap factors C12, C13, C14, C15, C16, and "0", and sequentially selects and outputs any of the tap factors according to control signals from the tap controlling unit 12. The selector SEL4 receives a tap factor C16 or "0", and selects and outputs either of the tap factors according to control signals from the tap controlling unit 12. Here, the selectors SEL0 and SEL1 both receive the tap factors C4 and C5, for example. Both the selectors SEL1 and SEL2 receive the tap factors C8 and C9. Likewise, in the present embodiment, selectors adjacent to one another share a part of tap factors. That is to say, the selectors SEL0–SEL4, have a configuration significantly different from conventional ones.

The multipliers MLT0–MLT4 multiply the input data DIN output from the flip-flops FF0–FF4 by the tap factors output from the selectors SEL0–SEL4, respectively, and output the results of the multiplication to the adder ADT. The adder ADT adds the multiplication results from the multipliers MLT0–MLT4 in sequence, and outputs the resultant as output data DOUT.

The tap controlling unit 12 receives the sampling trigger signal STRG, a clock signal CLK, and a tap trigger signal TTRG, and outputs control signals to the individual selectors SEL0–SEL4. The sampling trigger signal STRG is a signal to shift the input data DIN in the shift register 10. The clock signal CLK is a signal to switch the tap factors sequentially in the selectors SEL0–SEL4. The tap trigger signal TTRG is a signal to increment or decrement by one the number of oversamples, which signifies the number of times oversampling is performed. In this embodiment, the tap trigger signal TTRG has a frequency four times higher than the frequency of the clock signal CLK. That is, this FIR filter 2 operates as an FIR filter with sixteen taps for four-times oversampling. In other words, each time the shift register 10 shifts the input data DIN, the selectors SEL0–SEL4 each makes four selections of tap factors.

Figure 3:
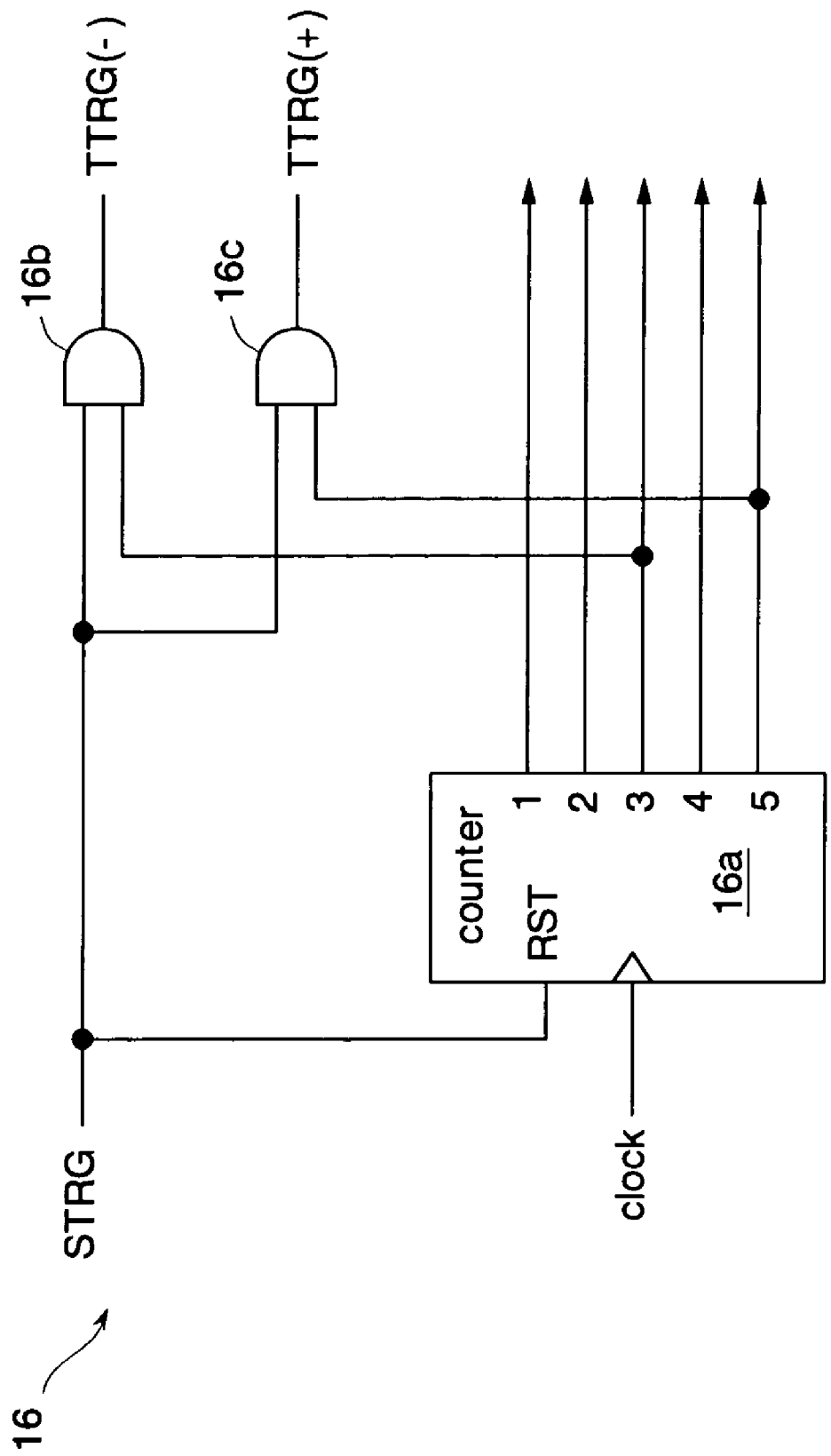
FIG. 3 is a circuit diagram showing an example of a generator of tap trigger signals.

FIG. 3 shows an example of a generator of the tap trigger signal TTRG. This generator 16 is formed, for example, in the transmitting circuit 6 shown in FIG. 1.

This generator 16 has: a binary counter 16a which is reset by the sampling trigger signal STRG and counts up the clock signal CLK; and AND circuits 16b and 16c which generate tap trigger signals TTRG(−) and TTRG(+), respectively. The AND circuit 16b outputs the tap trigger signal TTRG(−) while the sampling trigger signal STRG and the counter value "3" of the counter 16a are activated. The AND circuit 16c outputs the tap trigger signal TTRG(+) while the sampling trigger signal STRG and the counter value "5" of the counter 16a are activated. The tap trigger signals TTRG(−) and TTRG(+) are supplied as the tap trigger signal TTRG to the tap controlling unit 12 shown in FIG. 2. Then, the tap trigger signal TTRG(−) or TTRG(+) is activated when the number of oversamples is changed from four (standard) to three or from four to five, respectively.

Next, description will be given of the operation of the above-described FIR filter.

Figure 4:
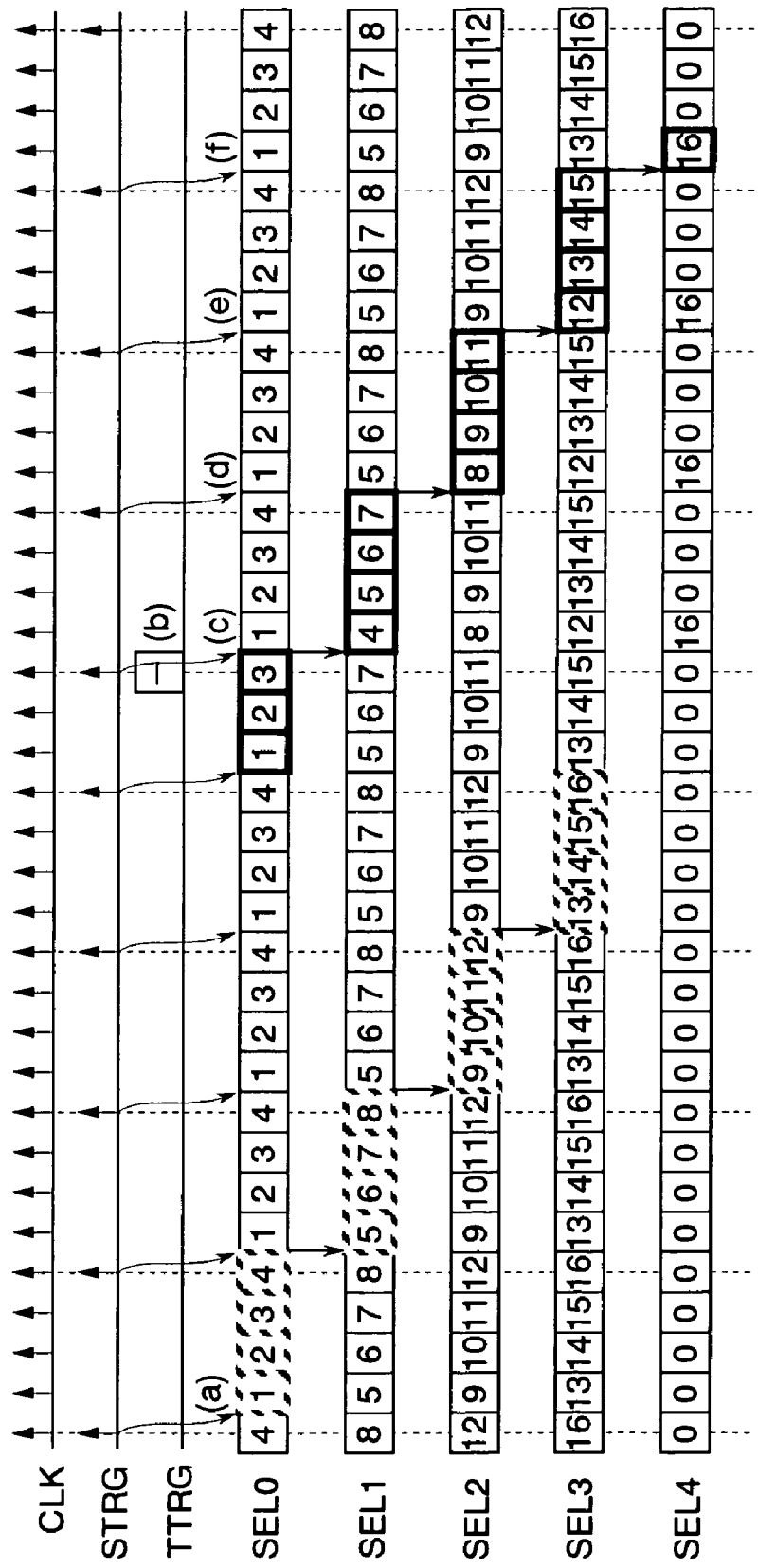
FIG. 4 is an explanatory diagram showing an operation of the FIR filter in the first embodiment.

FIG. 4 shows a case where the number of oversamples is changed from four to three while the FIR filter is in operation.

Under the control of the tap controlling unit 12, the selectors SEL0–SEL4 shown in FIG. 2 sequentially switch the tap factors in synchronization with the clock signal CLK. Besides, under the control of the tap controlling unit 12, the selectors SEL0–SEL4 select predetermined tap factors in synchronization with the sampling trigger signal STRG. The numerals in frames indicate the number of the tap factors selected by the selectors SEL0–SEL4.

For example, while the tap trigger signal TTRG is inactivated, the selectors SEL0–SEL4 select the tap factors C1, C5, C9, C9 C13, and "0", respectively, in synchronization with the sampling trigger signal STRG (FIG. 4(a)). Subsequently, the selectors SEL0–SEL4 select the tap factors shown in FIG. 2 in sequence, starting from the left of the diagram until the sampling trigger signal STRG is activated. As a result, the selectors SEL0–SEL3 select the continuous sixteen tap factors C1–C16 as indicated with the dashed thick frames. The selected tap factors C1–C16 are individually multiplied by the input data (DIN). Then, the multiplication results are added and output as the output data (DOUT).

On the other hand, in the case of decrementing the number of oversamples by one, the sampling trigger signal STRG is made one clock shorter in the interval of activation. Then, the tap trigger signal TTRG(−) is activated in synchronization with the sampling trigger signal (FIG. 4(b)). Here, the selectors SEL0–SEL4 select the tap factors C1, C4, C8, C12, and C16, respectively (FIG. 4(c)). That is, in accordance with the change in the number of oversamples, the tap controlling unit 12 shown in FIG. 2 instructs the selectors SEL0–SEL4 tap factors to be selected first after the acceptance of the input data DIN. The tap factors C4, C8, and C12 selected by the selectors SEL1, SEL2, and SEL3 precede the tap factors C5, C9, and C13, respectively, when the number of oversamples is four (standard).

Consequently, before and after the activation of the tap trigger signal TTRG(−), the selector SEL0 switches its tap factor to C1, C2, C3, C1 , C2, . . . in sequence. The selector SEL1 switches its tap factor to C5, C6, C7, C4, C5, . . . in sequence. The selector SEL2 switches its tap factor to C9, C10, C11, C8, C9, . . . in sequence. The selector SEL3 switches its tap factor to C13, C14, C15, C12, C13, . . . in sequence. The selector SEL4 switches its tap factor to "0", "0", "0", C16, "0", . . . in sequence. Since the selector SEL3 does not select the tap factor C16 but C12, the number of oversamples on the corresponding input data becomes three.

On the next activation of the sampling trigger signal STRG, the selectors SEL0 and SEL1 select their standard tap factors C1 and C5, respectively (FIG. 4(d)). The selectors SEL2, SEL3, and SEL4 select the tap factors C8, C12, and C16, respectively, which are the same as the ones previously selected. On the next activation of the sampling trigger signal STRG, the selectors SEL0–SEL2 select their standard tap factors C1, C5, and C9, respectively (FIG. 4(e)). The selectors SEL3 and SEL4 select the tap factors C12 and C16, respectively, which are the same as the ones previously selected. On the next activation of the sampling trigger signal STRG, the selectors SEL0–SEL3 select their standard tap factors C1, C5, C9, and C13, respectively (FIG. 4(f)). The selector SEL4 selects the tap factor C16 which is the same as the one previously selected. Then, on the next activation of the sampling trigger signal STRG, the selectors SEL0–SEL4 select their standard tap factors C1, C5, C9, C13, and "0", respectively.

In this way, each time the sampling trigger signal STRG is activated, the tap factors are sequentially changed back to the standard tap factors, which starts from the selector corresponding to the input-side flip-flop shown in FIG. 2, to decrement the number of oversamples. Then, as shown by the thick frames in full lines, the input data (DIN) is multiplied by the tap factors C1–C16 in sequence and output as the output data (DOUT). That is, the continuity in output response is maintained.

Figure 5:
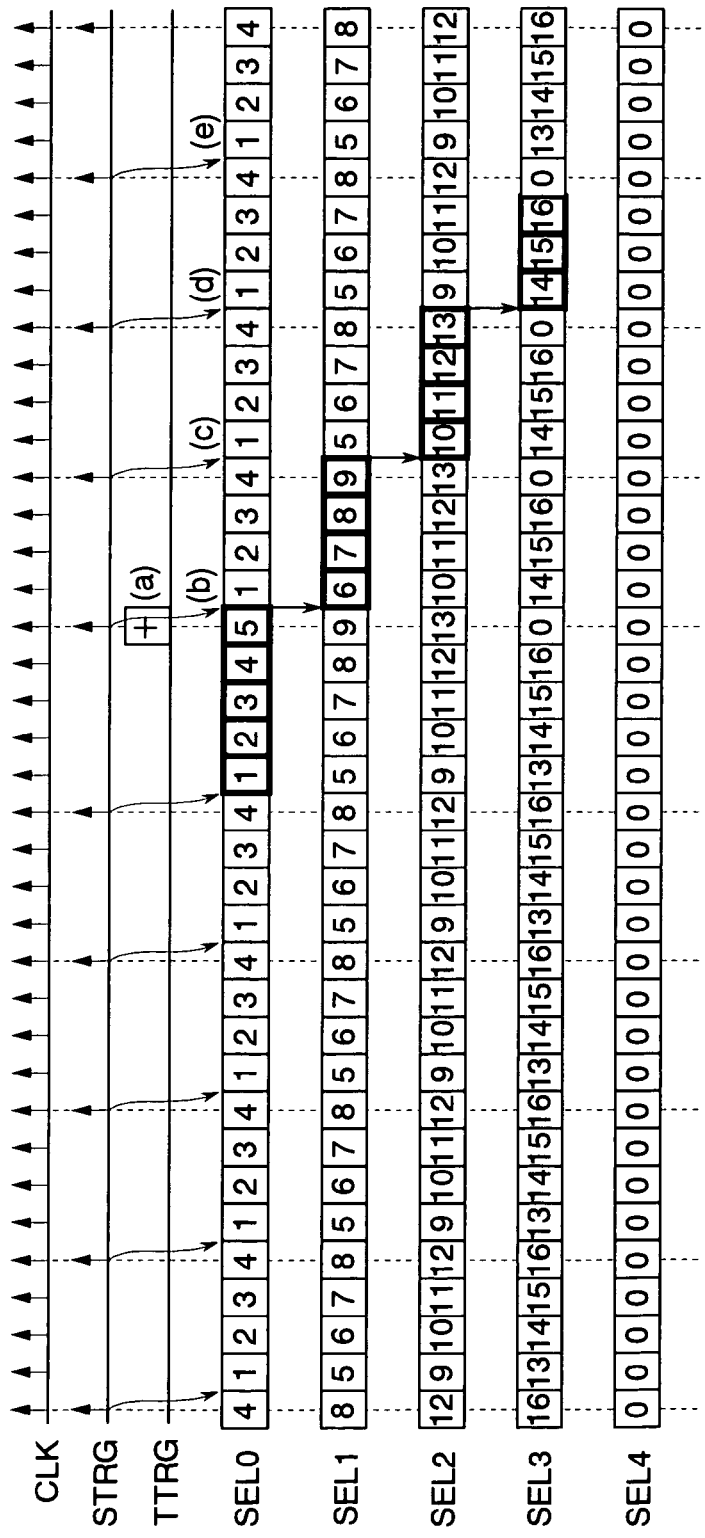
FIG. 5 is an explanatory diagram showing another operation of the FIR filter in the first embodiment.

FIG. 5 shows a case where the number of oversamples is changed from four to five while the FIR filter is in operation. Incidentally, in the cases of incrementing the number of oversamples, the selector SEL4 selects "0", at all times.

When the number of oversamples is four, the selectors SEL0–SEL4 each perform the same operations as in FIG. 4; therefore, description thereof will be omitted.

In case of incrementing the number of oversamples by one, the sampling trigger signal STRG is made one clock longer in the interval of activation. Then, the tap trigger signal TTRG(+) is activated in synchronization with the sampling trigger signal (FIG. 5(a)). Subsequently, the selectors SEL0–SEL3 select the tap factors C1, C6, C10, and C14, respectively (FIG. 5(b)). The tap factors C6, C10, and C14 selected by the selectors SEL1–SEL3 succeed the tap factors C5, C9, and C13, respectively, when the number of oversamples is four (standard).

The selector SEL3 selecting the tap factor "0" once, makes the number of oversamples on the corresponding input data five.

Before and after the activation of the tap trigger signal TTRG(+), the selector SEL0 switches its tap factor to C1, C2, C3, C4, C5, C1, C2, . . . in sequence. The selector SEL1 switches its tap factor to C5, C6, C7, C8, C9, C6, C7, . . . in sequence. The selector SEL2 switches its tap factor to C9, C10, C11, C12, C13, C10, C11, . . . in sequence. The selector SEL3 switches its tap factor to C13, C14, C15, C16, "0", C14, C15, . . . in sequence. Since the selector SEL3 selects the tap factor "0", the number of oversamples on the corresponding input data becomes five.

On the next activation of the sampling trigger signal STRG, the selectors SEL0 and SEL1 select their standard tap factors C1 and C5, respectively (FIG. 5(c)). The selectors SEL2 and SEL3 select the tap factors C10 and C14, respectively, which are the same as the ones previously selected. On the next activation of the sampling trigger signal STRG, the selectors SEL0–SEL2 select their standard tap factors C1, C5, and C9, respectively (FIG. 5(d)). The selector SEL3 selects the tap factor C14 which is the same as the one previously selected. On the next activation of the sampling trigger signal STRG, the selectors SEL0–SEL3 select their standard tap factors C1, C5, C9, and C13, respectively (FIG. 5(e)).

In this way, each time the sampling trigger signal STRG is activated, the selectors the tap factors are changed back to the standard tap factors, which starts from the selector corresponding to the input-side flip-flop shown in FIG. 2, to increment the number of oversamples. Then, as shown by the thick frames in full lines, the input data (DIN) is multiplied by the tap factors C1–C16 in sequence and output as the output data (DOUT). That is, the continuity in output response is maintained.

Note that in this embodiment the number of oversamples can be changed only once during a period over which the filter continues to respond to a single piece of input data DIN. That is, in FIG. 4, the number of oversamples can be decreased or increased only once during the sixteen oversampling periods (the periods over the thick frames in full lines).

As described above, in this embodiment, the tap factors to be selected by the selectors SEL0–SEL4 are changed in accordance with a change in the number of oversamples. This ensures the continuity of the output data DOUT. Since the holding parts need not be provided as many as the number corresponding to the number of oversamples, the oversampling FIR filter can be reduced in circuit scale.

A part of the tap factors selectable by the selectors SEL0–SEL4 are shared. Therefore, the tap factors to be selected for input data DIN can be secured by the whole selectors, whereby the continuity of the output data DOUT can be maintained.

In accordance with the number of oversamples, the tap controlling unit 12 instructs the selectors SEL0–SEL4 tap factors to be selected first after the acceptance of input data DIN. The selectors SEL0–SEL4 have only to select tap factors according to the instructions, and therefore the control mechanism can be simplified. This consequently allows high speed filtering operations. Moreover, the application of the present invention can prevent a rise in cost due to the simplified control mechanism.

In response to the shift operations of the shift register 10 after the instructions, the tap controlling unit 12 controls over changing the predetermined tap factors selected by the selectors SEL0–SEL4 back to the predetermined tap factors before the changing of the number of oversamples, in which the changes of the tap factors are performed in sequence, starting from the selectors SEL0 to SEL4 corresponding to the input-side hold parts FF0–FF4. Therefore, the continuity of the output data DOUT can be maintained before and after the change of the number of oversamples.

Figure 6:
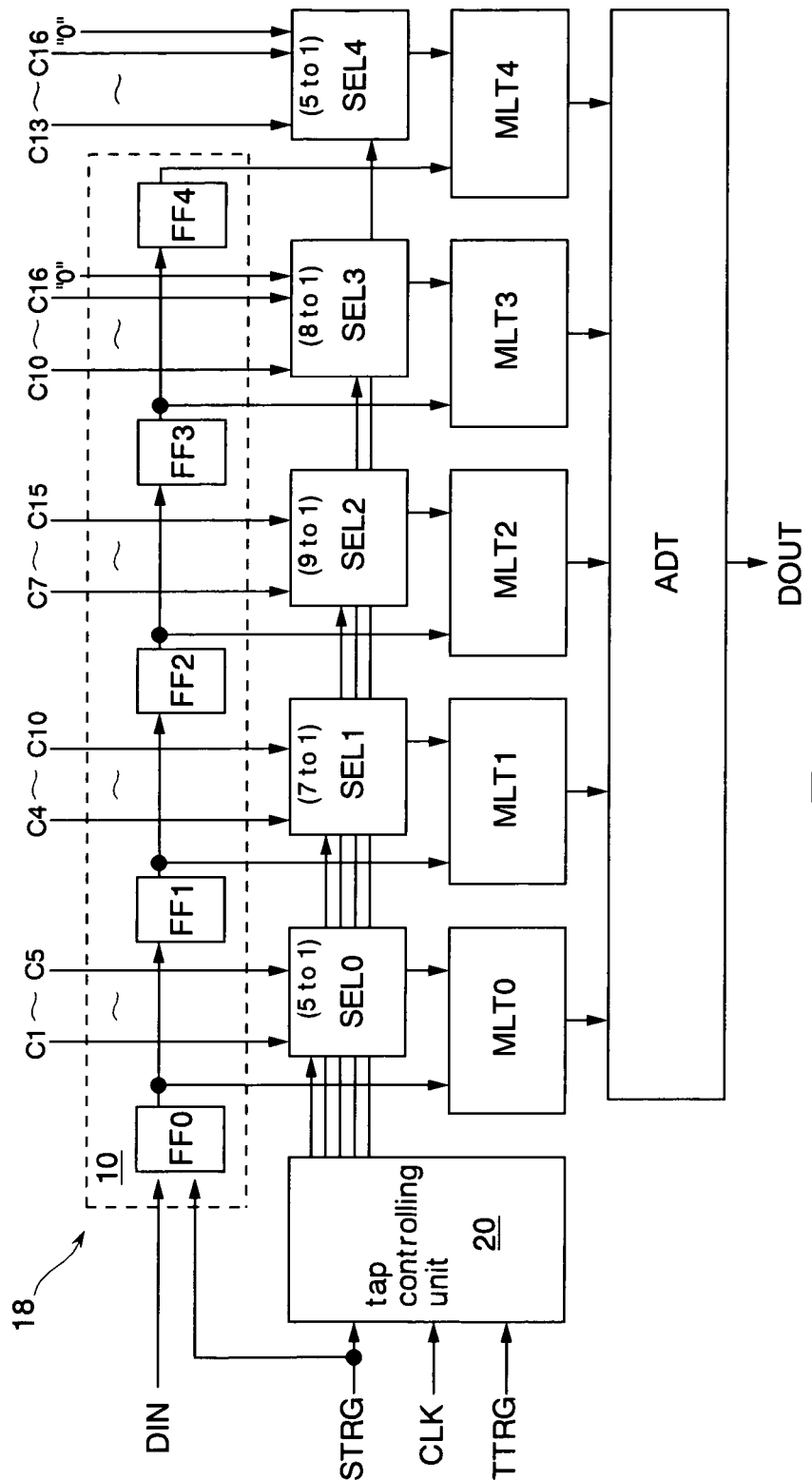
FIG. 6 is a block diagram showing an oversampling FIR filter according to a second embodiment of the present invention.

FIG. 6 shows an oversampling FIR filter 18 according to a second embodiment of the present invention. The same circuits and signals as those described in the first embodiment will be designated by identical reference numbers, and detailed description thereof will be omitted.

As in the first embodiment, the oversampling FIR filter 18 is used, for example, in a transmitting circuit (semiconductor integrated circuit) of a portable terminal in a CDMA or W-CDMA (Wideband-CDMA) communication system. In this embodiment, a tap control unit 20 is formed instead of the tap control unit 12 in the first embodiment. The other configuration is identical to that of the first embodiment.

The number of tap factors selectable by the selectors SEL0–SEL4 is obtained from the following expressions (1) and (2). The expressions (1) and (2) signify the required number of tap factors prior and subsequent to four standard tap factors (for example, the tap factors C5–C8 in SEL1), respectively.

$$OVR \times (SL+1) - \{(OVR-1) \times SL + OVR\} \quad (1)$$

$$OVR \times (SL+1) - (OVR-1) \times (SL+1) \quad (2)$$

(OVR: the number of oversamples,
SL: the number of selectors SEL)

Specifically, the selector SEL0 can select tap factors C1, C2, C3, C4, and C5 where no tap factor is added prior to the standard tap factors C1, C2, C3, and C4 and one added subsequent to the same. The selector SEL1 can select C4, C5, C6, C7, C8, C9, and C10 where one tap factor is added prior to the standard tap factors C5, C6, C7, and C8 and two added subsequent to the same. The selector SEL2 can select C7, C8, C9, C10, C11, C12, C13, C14, and C15 where two tap factors are added to prior to the standard tap factors C9, C10, C11, and C12 and three added subsequent to the same. The selector SEL3 can select C10, C11, C12, C13, C14, C15, C16, "0", "0", "0", and "0" where three tap factors are added prior to the standard tap factors C13, C14, C15, and C16 and four added subsequent to the same. The selector SEL4 can select tap factors "0", . . . where four tap factors are added prior to the standard tap factors "0", "0", "0", "0", and five added subsequent to the same. As described above, all the tap factors subsequent to C16 are "0".

The tap controlling unit 20, having flip-flops (not shown) corresponding to the flip-flops FF0–FF4 in the shift register 10, holds received tap trigger signals TTRG(–) and TTRG(+) along with the times thereof. According to the information held in the flip-flops, the tap controlling unit 20 controls the number of tap factors to be selected by the selectors SEL0–SEL4.

Note that in this embodiment the number of oversamples can be decremented or incremented by one a plurality of times during a period where the filter continues to respond to a single piece of input data DIN.

Here, the number of selectable tap factors obtained by the above-mentioned expressions (1) and (2) are the numbers required for the maximum changes in the continuity limit of the filter responses.

Figure 7:
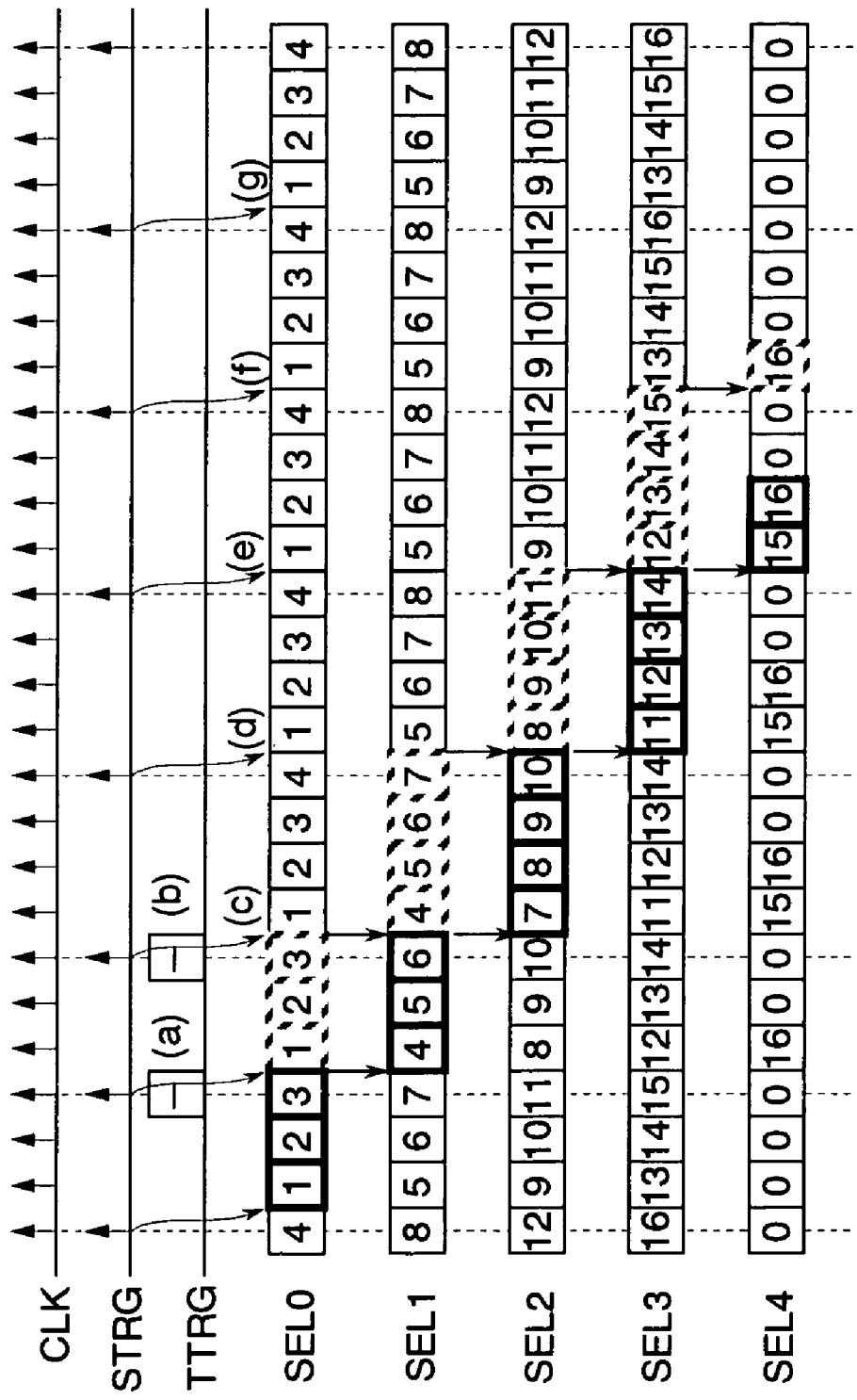
FIG. 7 is an explanatory diagram showing an operation of the FIR filter in the second embodiment.

FIG. 7 shows a case where the number of oversamples is successively decremented twice while the FIR filter is in operation. That is, the tap trigger signal TTRG(–) is successively activated twice in synchronization with the sampling trigger signal STRG. The operation accompanied by the first activation of the tap trigger signal TTRG(–) (FIG. 7(a)) is identical to that of FIG. 4 described above, and therefore description thereof will be omitted.

On the second activation of the tap trigger signal TTRG(–) (FIG. 7(b)), the selectors SEL0–SEL4 select tap factors different from those selected upon the first activation of the tap trigger signal TTRG(–).

Initially, the selectors SEL0–SEL4 select the tap factors C1, C4, C7, C11, and C15, respectively (FIG. 7(c)). The tap factor C4 selected by the selector SEL1 precedes the tap factor C5 when the number of oversamples is four (standard). The tap factor C7 and C11 selected by the selectors SEL2 and SEL3 are second previous to the tap factors C9 and C13 when the number of oversamples is a standard.

Consequently, before and after the activation of the tap trigger signal TTRG(–), the selector SEL0 switches its tap factor to C1, C2, C3, C1, C2, . . . in sequence. The selector SEL1 switches its tap factor to C4, C5, C6, C4, C5, . . . in sequence. The selector SEL2 switches its tap factor to C8, C9, C10, C7, C8, . . . in sequence. The selector SEL3 switches its tap factor to C12, C13, C14, C11, C12, . . . in sequence. The selector SEL4 switches its tap factor to C16, "0", "0", C15, C16, . . . in sequence. Since the selector SEL3 does not select the tap factor C15 but C11, the number of oversamples on the corresponding input data becomes two in the selector SEL4.

On the next activation of the sampling trigger signal STRG, the selectors SEL0 and SEL1 select their standard tap factors C1 and C5, respectively. The selector SEL2 selects the tap factor C8 subsequent to the tap factor C7 (FIG. 7(d)). The selectors SEL3 and SEL4 select the tap factors C11 and C15, respectively, which are the same as the ones previously selected. On the next activation of the sampling trigger signal STRG, the selectors SEL0–SEL2 select their standard tap factors C1, C5, and C9, respectively (FIG. 7(e)). The selector SEL3 selects the tap factor C12 subsequent to the tap factor C11. The selector SEL4 selects the tap factor C15 which is the same as the one previously selected. On the next activation of the sampling trigger signal STRG, the selectors SEL0–SEL3 select their standard tap factors C1, C5, C9, and C13, respectively (FIG. 7(f)). The selector SEL4 selects the tap factor C16 subsequent to the tap factor C15. Then, on the next activation of the sampling trigger signal STRG, the selectors SEL0–SEL4 select their standard tap factors C1, C5, C9, C13, and "0", respectively (FIG. 7(g)).

As a result, the continuity in output response is maintained even when the number of oversamples is successively decremented a plurality of times.

Figure 8:
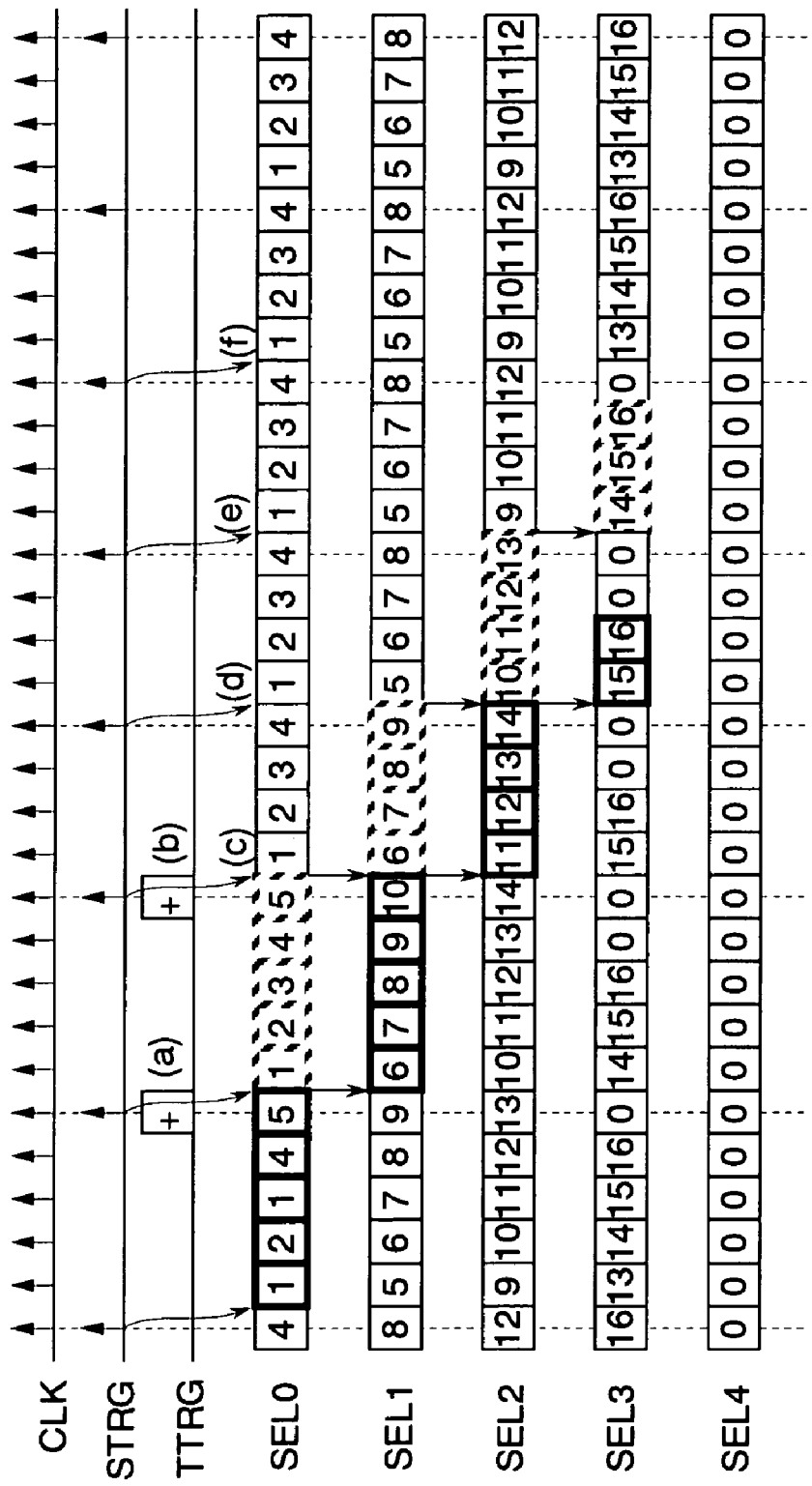
FIG. 8 is an explanatory diagram showing another operation of the FIR filter in the second embodiment.

FIG. 8 shows a case where the number of oversamples is incremented twice in succession while the FIR filter is in operation. That is, the tap trigger signal TTRG(+) is successively activated twice in synchronization with the sampling trigger signal STRG. The operation that follows the first activation of the tap trigger signal TTRG(+) (FIG. 8(a)) is identical to that of FIG. 5 described above, and therefore description thereof will be omitted. Besides, when the tap trigger signal TTRG(+) is activated, the selector SEL4 is supplied with "0" at all times. Accordingly, description of the selector SEL4 will be omitted.

On the second activation of the tap trigger signal TTRG (+) (FIG. 8(b)), the selectors SEL0, SEL1, SEL2, and SEL3 select tap factors different from those selected upon the first activation of the tap trigger signal TTRG(+). These are controlled by the tap controlling unit 26.

Initially, the selectors SEL0–SEL3 select the tap factors C1, C6, C11, and C15, respectively (FIG. 8(c)). The tap factor C6 selected by the selector SEL1 and the tap factors C11 and C15 respectively selected by the SEL2 and SEL3 succeed the tap factors C5 and secondly succeed C9 and C13, when the number of oversamples is four (standard).

Before and after the activation of the tap trigger signal TTRG(+), the selector SEL0 switches its tap factor to C2, C3, C4, C5, C1, C2, . . . in sequence. The selector SEL1 switches its tap factor to C7, C8, C9, C10, C6, C7, . . . in sequence. The selector SEL2 switches its tap factor to C11, C12, C13, C14, C11, C12, . . . in sequence. The selector SEL3 switches its tap factor to C15, C16, "0", "0", C15, C16, . . . in sequence. The selector SEL3 selects the tap factor "0", twice to provide two data sections in which the number of oversamples on the corresponding input data is "3".

On the next activation of the sampling trigger signal STRG, the selectors SEL0 and SEL1 select their standard tap factors C1 and C5, respectively (FIG. 8(d)). The selector SEL2 selects the tap factor C10 prior to the one previously selected. The selector SEL3 selects the tap factor C15 which is the same as the one previously selected. On the next activation of the sampling trigger signal STRG, the selectors SEL0–SEL2 select their standard tap factors C1, C5, and C9, respectively (FIG. 8(e)). The selector SEL3 selects the tap factor C14 prior to the one previously selected. On the next activation of the sampling trigger signal STRG, the selectors SEL0–SEL3 select their standard tap factors C1, C5, C9, and C13, respectively (FIG. 8(f)).

As a result, the continuity in output response is maintained even if the number of oversamples is successively incremented a plurality of times.

Figure 9:
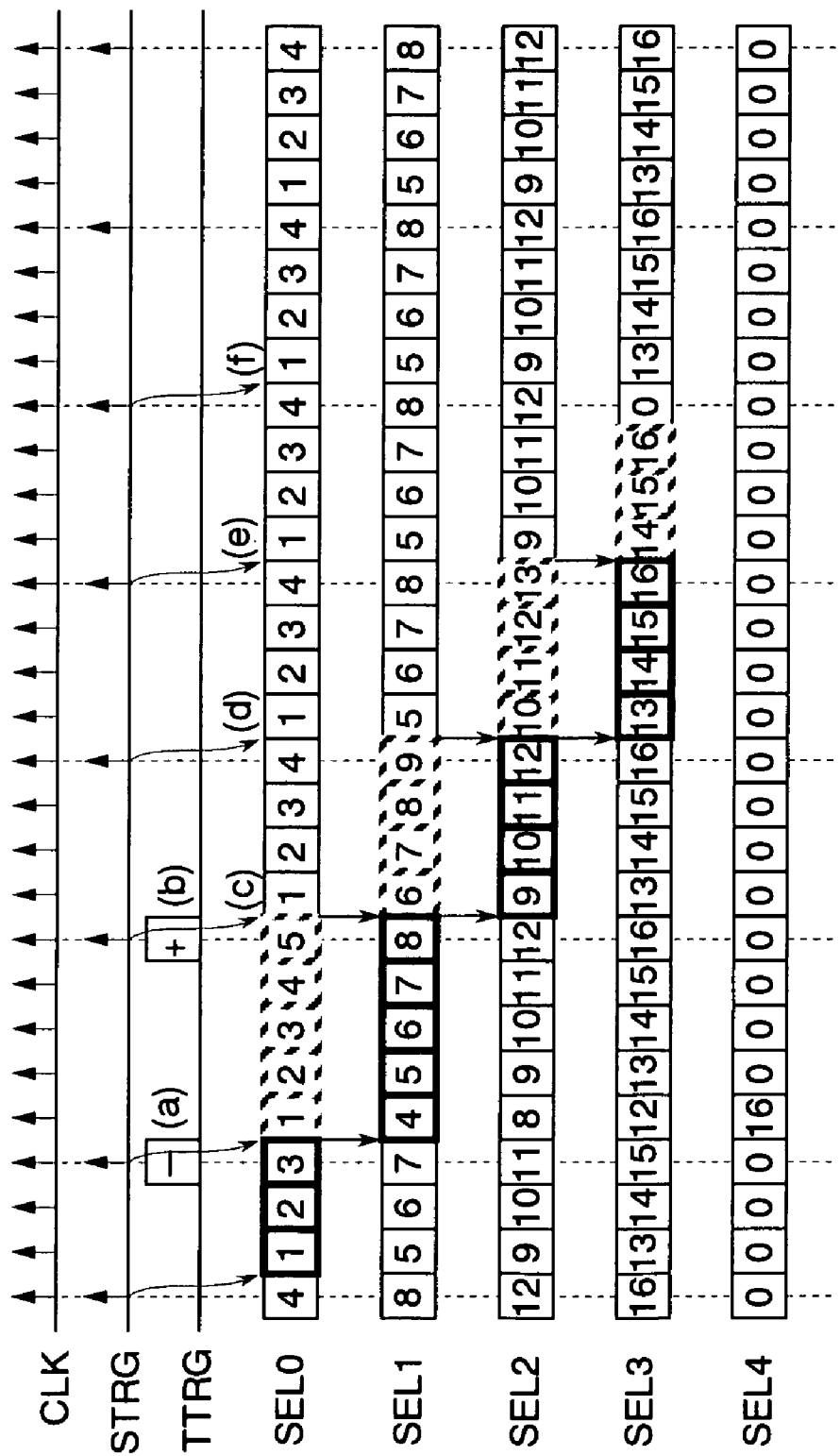
FIG. 9 is an explanatory diagram showing another operation of the FIR filter in the second embodiment.

FIG. 9 shows a case where the number of oversamples is decremented once from the standard and immediately incremented once from the standard. That is, the tap trigger signal TTRG(−) is activated in synchronization with the sampling trigger signal STRG, and then TTRG(+) is activated. The operation that follows the first activation of the tap trigger signal TTRG(−) (FIG. 9(a)) is identical to that of FIG. 5 described above, and therefore description thereof will be omitted.

When the tap trigger signal TTRG(+) is activated, the selectors SEL0–SEL3 select their standard tap factors C1, C6, C9, and C13, respectively (FIG. 9(c)). The tap factor is selected by the selector SEL0 when the number of oversamples is a standard. The tap factor C6 selected by the selector SEL1 precedes the tap factor CS which is selected when the number of oversamples is a standard.

Before and after the activation of the tap trigger signal TTRG(+), the selector SEL0 switches its tap factor to C2, C3, C4, C5, C1, C2, . . . in sequence. The selector SEL1 switches its tap factor to C5, C6, C7, C8, C6, C7, . . . in sequence. The selector SEL2 switches its tap factor to C9, C10, C1, C12, C9, C10, . . . in sequence. The selector SEL3 switches its tap factor to C13, C14, C15, C16, C13, C14, . . . in sequence.

On the next activation of the sampling trigger signal STRG, the selectors SEL0, SEL1, and SEL3 select their standard tap factors C1, C5, and C13, respectively (FIG. 9(d)). The selector SEL2 selects the tap factor C10 subsequent to firstly selected the tap factor C9. On the next activation of the sampling trigger signal STRG, the selectors SEL0–SEL2 select their standard tap factors C1, C5, and C9, respectively (FIG. 9(e)). The selector SEL3 selects the tap factor C14 subsequent to the one previously selected. On the next activation of the sampling trigger signal STRG, the selectors SEL0–SEL3 select their standard tap factors C1, C5, C9, and C13, respectively (FIG. 9(f)).

As a result, the continuity in output response is maintained even when the number of oversamples is decremented and incremented successively.

This embodiment can offer the same effects as those obtained from the first embodiment described above. Besides, in this embodiment, the decrement/increment in the number of oversamples can be switched successively during a period where the filter continues to respond to a single piece of input data DIN.

Figure 10:
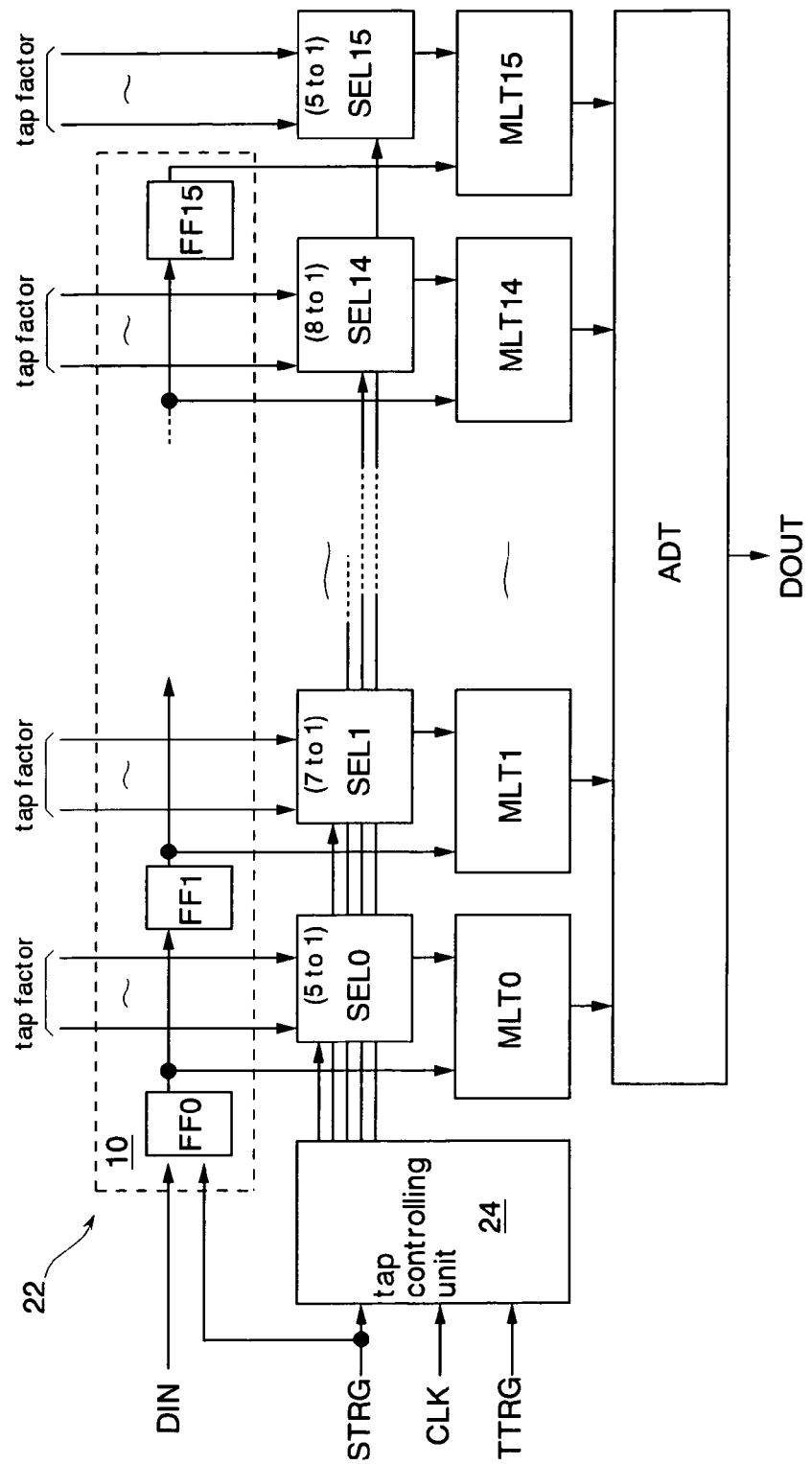
FIG. 10 is a block diagram showing an oversampling FIR filter according to a third embodiment of the present invention.

FIG. 10 shows an oversampling FIR filter 22 according to a third embodiment of the present invention. The same circuits and signals as those described in the first embodiment will be designated by identical reference numbers, and detailed description thereof will be omitted.

As in the first embodiment, the oversampling FIR filter 22 is used, for example, in a transmitting circuit (semiconductor integrated circuit) of a portable terminal in a CDMA or W-CDMA (Wideband-CDMA) communication system.

The oversampling FIR filter 22 includes: a shift register 32 having sixteen flip-flops FF0–FF15 for holding input data, connected in series from the input side; selectors SEL0–SEL15 and multipliers MLT0–MLT15 formed corresponding to the flip-flops FF0–FF15, respectively; an adder ADT; and a tap controlling unit 24. The multipliers MLT0–MLT15 multiply the input data DIN output from the flip-flops FF0–FF15 by the tap factors output from the selectors SEL0–SEL15, respectively, and output the results of the multiplication to the adder ADT.

The tap controlling unit 24, having flip-flops (not shown) corresponding to the flip-flops FF0–FF15, holds a received tap trigger signal TTRG and the time thereof. Based on the information held in the flip-flops, the tap controlling unit 24 controls the number of tap factors to be selected by the selectors SEL0–SEL15. The tap controlling unit 25 outputs any of TTRG(−3), TTRG(−2), TTRG(−1), TTRG(+1), TTRG(+2), and TTRG(+3) as the tap trigger signal TTRG. That is, in this embodiment, the number of oversamples can be decremented or incremented by "3" at maximum (maximum shift amount M of the number of oversamples, to be described later) during a period where the filter continues to respond to a single piece of input data DIN. In other respects, the basic connections inside the oversampling FIR filter 22 are the same as those of the first embodiment.

The tap factors selectable by the selectors SEL0–SEL15 are obtained from the following expressions (3) and (4). The expressions (3) and (4) signify the required number of tap factors prior and subsequent to the standard tap factors (in four), respectively.

$$OVR \times (SL+1) - \{(OVR-M) \times SL + OVR\} \quad (3)$$

$$OVR \times (SL+1) - (OVR-M) \times (SL+1) \quad (4)$$

(OVR: the number of oversamples,
M: maximum shift amount of the number of oversamples,
SL: the number of the selectors SEL0–SEL15)

Next, description will be given of the operation of the above-described FIR filter. In the following example, selectors for selecting tap factors other than "0" will be exclusively shown for description.

Figure 11:
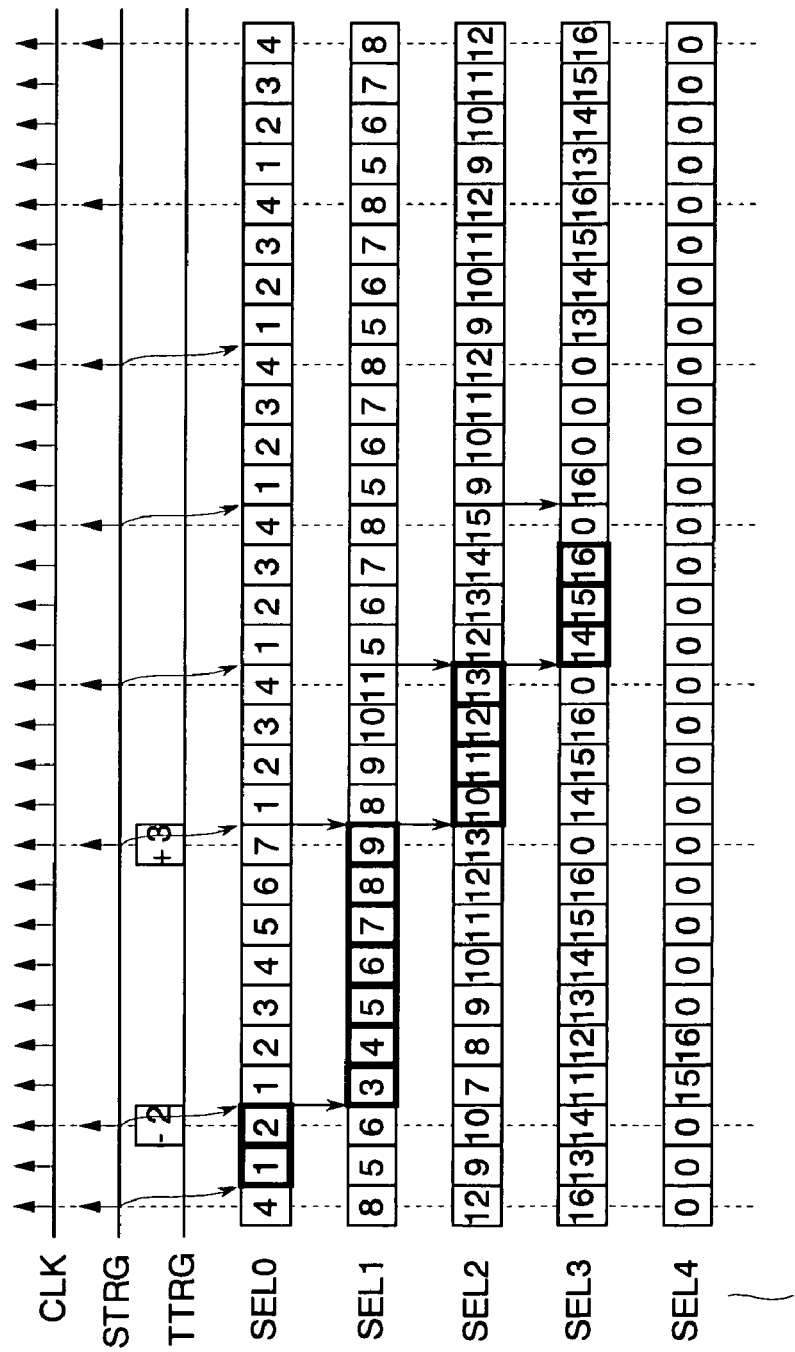
FIG. 11 is an explanatory diagram showing an operation of the FIR filter in the third embodiment.

FIG. 11 shows a case where the number of oversamples is decremented by two from the standard and then incremented by three from the standard. Here, the tap trigger signal TTRG (−2) is first activated in synchronization with the sampling trigger signal STRG, and the tap trigger signal TTRG (+3) is activated next.

According to on the information held in the flip-flops, the tap controlling unit 24 controls the selectors SEL0–SEL15 so as to select successive tap factors. Then, as shown by the thick frames in the diagram, the successive tap factors C1–C16 and the input data (DIN) are respectively multiplied each other. As a result, the continuity in output response is maintained.

Figure 12:
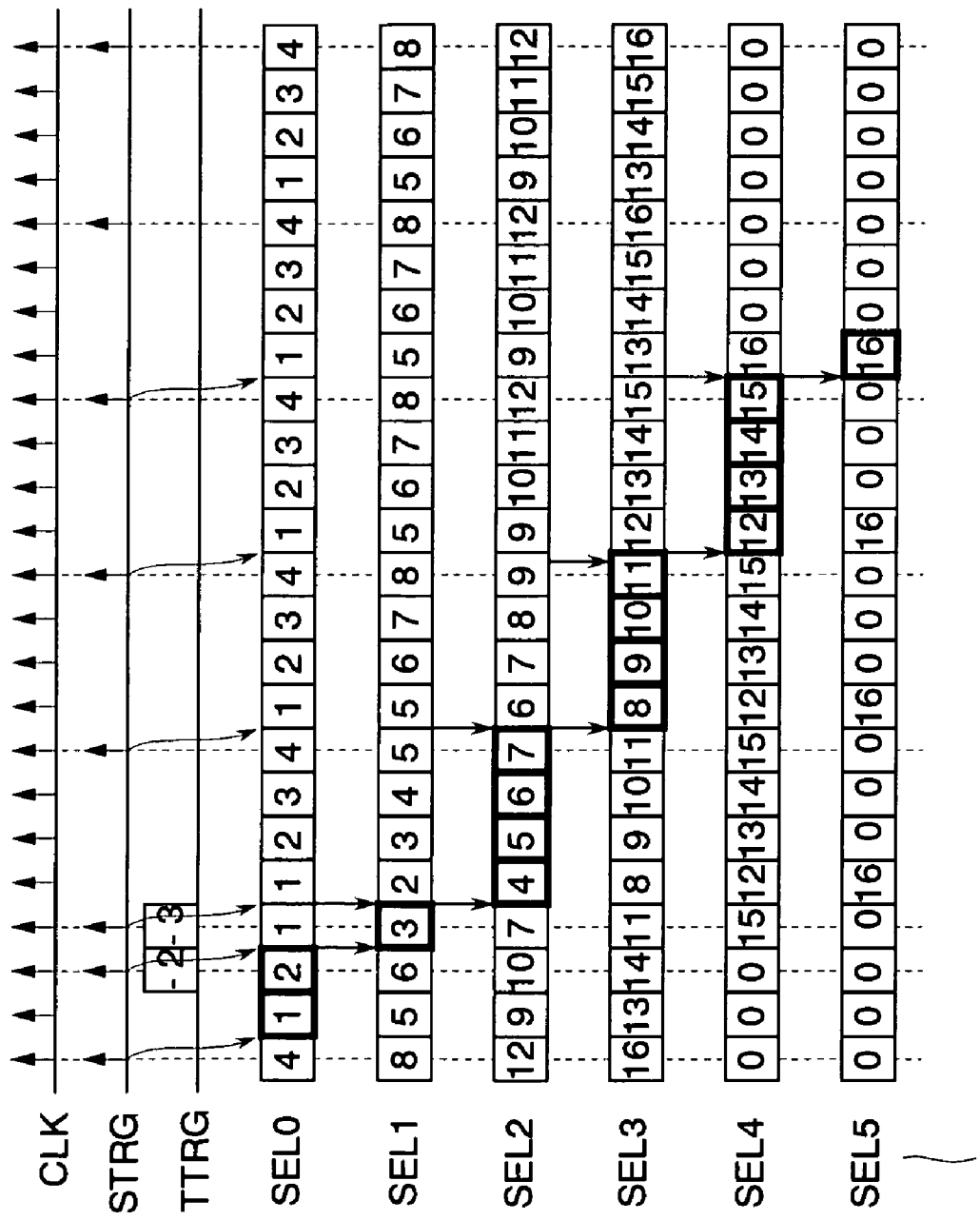
FIG. 12 is an explanatory diagram showing another operation of the FIR filter in the third embodiment.

FIG. 12 shows a case where the number of oversamples is decremented by two from the standard and then further decremented by three from the standard. Here, the tap trigger signal TTRG (−2) is first activated in synchronization with the sampling trigger signal STRG, and the tap trigger signal TTRG (−3) is activated next.

Figure 13:
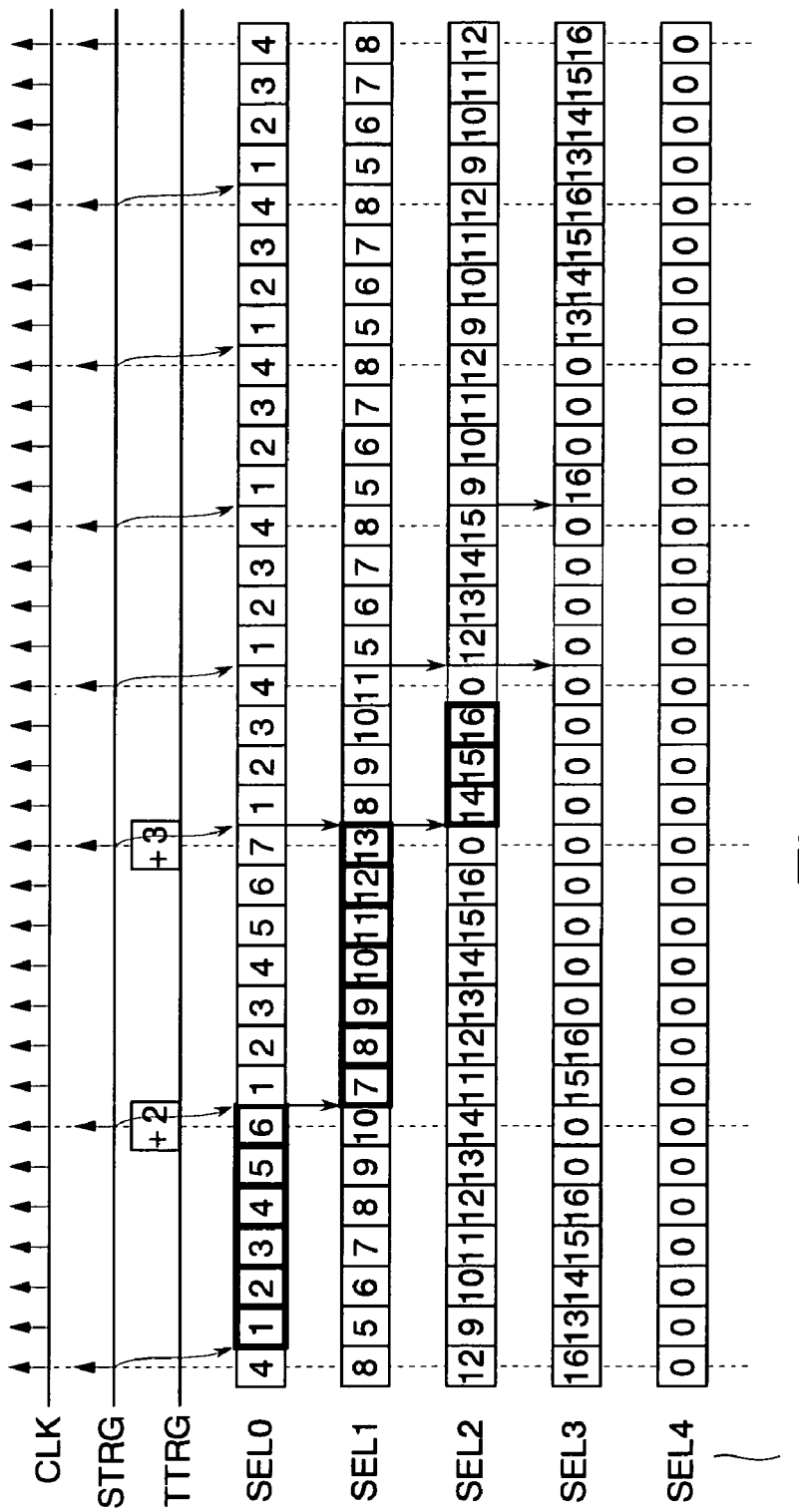
FIG. 13 is an explanatory diagram showing another operation of the FIR filter in the third embodiment.

FIG. 13 shows a case where the number of oversamples is incremented by two from the standard and then further incremented by three from the standard. Here, the tap trigger signal TTRG (+2) is first activated in synchronization with the sampling trigger signal STRG, and the tap trigger signal TTRG (+3) is activated next.

In FIGS. 12 and 13, the successive tap factors C1–C16 and the input data (DIN) are also multiplied each other as shown by the thick frames, so that the continuity of output responses is maintained.

This embodiment can offer the same effects as those obtained from the first embodiment described above. Besides, in this embodiment, the multiple decrement/increment in the number of oversamples can be switched successively during a period where the filter continues to respond to a single piece of input data DIN.

Here, the number of selectable tap factors obtained by the above-mentioned expressions (3) and (4) are required for the maximum changes in the continuity limit of the filter responses.

The first embodiment described above has dealt with the case where the selectors SEL0–SEL4 receive tap factors from exterior. However, the present invention is not limited to such an embodiment. For example, circuits for prestoring tap factors may be formed inside the selectors SEL0–SEL4.

The above-described embodiments have dealt with the cases where the generator shown in FIG. 3 is formed in the transmitting circuit 6. However, the present invention is not limited to such an embodiment. For example, the generator may be formed aside from the semiconductor integrated circuit implementing the FIR filter 2. Moreover, the generator 16 shown in FIG. 3 may be constituted by software.

The invention is not limited to the above embodiments and various modifications may be made without departing from the spirit and the scope of the invention. Any improvement may be made in part or all of the components.

What is claimed is:

1. An oversampling FIR filter for filtering with a clock having a frequency higher than a frequency of accepting input data, comprising:
    a shift register having a plurality of holding parts connected in cascade for sequentially accepting input data;
    a plurality of selectors respectively formed corresponding to said holding parts each selector selecting a predetermined number of individual tap factors from a plurality of tap fators, in which the selecting is done sequentially in each selector in synchronization with said clock;
    a plurality of multipliers formed respectively corresponding to said holding parts for respectively multiplying said input data held in said holding parts, by said tap factors selected by said selectors corresponding to said holding parts; and
    an adder for adding the multiplication results from said multipliers and outputting the resultants as output data, and wherein
    one of said selectors capable of changing its respective predetermined number of individual tap factors to be selected and at least one other of said selectors also capable of changing its respective predetermined number of individual tap factors, such changes being made in accordance with a change in the number of oversamples, which is the number of tap factors to be multiplied by said single input data and wherein said input data is multiplied always by the same total number of tap factors in the same order, regardless of the change in the number of oversamples.

2. The oversampling FIR filter according to claim 1, wherein a part of said plurality of tap factors respectively selectable by said selectors adjacent to one another are shared by said selectors.

3. The oversampling FIR filter according to claim 2, comprising a tap controlling unit for instructing said selectors which of said tap factor to be selected first in accordance with a change in said number of oversamples.

4. The oversampling FIR filter according to claim 2, wherein when said number of oversamples is changed, said tap controlling unit changes said tap factors selected by said selectors back to said predetermined tap factors used prior to the changing of said number of oversamples, in which every time said input data is accepted, the changes of said tap factors are performed in sequence, starting from said selector corresponding to said holding part at the input side.

5. A method for controlling an oversampling FIR filter for filtering with a clock having a frequency higher than a frequency of accepting input data, comprising the steps of:
    sequentially accepting input data at a shift register having a plurality of holding parts connected in cascade;
    selecting by each selector a predetermined number of individual tap factors from a plurality of tap factors, in which the selecting is done sequentially in each selector in synchronization with said clock by a plurality of selectors respectively formed corresponding to said holding parts;
    respectively multiplying said input data held in said holding parts by said tap factors selected by said selectors corresponding to said holding parts; and
    adding the multiplication results and outputting the resultants as output data; and changing said predetermined number of individual tap factors respectively to be selected by one of said selectors and also changing the rspective predetermined number of tap factors selected by at least one other of said selectors, such changes being made in accordance with a change in the number of oversamples, which is the number of tap factors to be multiplied by said single input data and wherein said input data is multiplied always by the same total number of tap factors in the same order, regardless of the change in the number of oversamples.

6. The method for controlling an oversampling FIR filter according to claim 5, wherein a part of said plurality of tap factors respectively selectable by said selectors adjacent to one another are shared by said selectors.

7. The method for controlling an oversampling FIR filter according to claim 6, comprising the step of instructing said selectors which of said tap factor to be selected first in accordance with a change in said number of oversamples.

8. The method for controlling an oversampling FIR filter according to claim 6, comprising the step of changing said tap factors selected by said selectors back to said predetermined tap factors used prior to the changing of said number of oversamples when said number of oversamples is changed, in which every time said input data is accepted, said changes of said tap factors are performed in sequence, starting from said selector corresponding to said holding part at the input side.

9. A semiconductor integrated circuit having an oversampling FIR filter, wherein said oversampling filter comprises:
a shift register having a plurality of holding parts connected in cascade for sequentially accepting input data;
a plurality of selectors respectively formed corresponding to said holding parts for each selector selecting a predetermined number of individual tap factors from a plurarity of tap factors, in which the selecting is done sequentially in each selector in synchronization with said clock;
a plurality of multipliers formed respectively corresponding to said holding parts respectively multiplying said input data held in said holding parts by said tap factors selected by said selectors corresponding to said holding parts; and
an adder for adding the multiplication results from said multipliers and outputting the resultants as output data, and wherein
one of said selectors capable of changing its respective predetermined number of individual tap factors to be selected and at least one other of said selectors also capable of changing its respective predetermined number of individual tap factors, such changes being made in accordance with a change in the number of oversamples, which is the number of tap factors to be multiplied by said single input data and wherein said input data is multiplied always by the same total number of tap factors in the same order, regardless of the change in the number of oversamples.

10. A communication system wherein data filtered with an oversampling FIR filter is transmitted, wherein said oversampling FIR filter comprises:
a shift register having a plurality of holding parts connected in cascade for sequentially accepting input data;
a plurality of selectors respectively formed corresponding to said holding parts each selector selecting a predetermined number of individual tap factors from a plurality of tap factors, in which the selecting is done sequentially in each selector in synchronization with said clock;
a plurality of multipliers formed respectively corresponding to said holding parts for respectively multiplying said input data held in said holding parts by said tap factors selected by said selectors corresponding to said holding parts; and
an adder for adding the multiplication results from said multipliers and outputting the resultants as output data, and wherein
one of said selectors being capable of changing its predetermined number of individual tap factors to be selected and at least one other of said selectors also being capable of changing its respective predetermined number of individual tap fctors, said changes being made in accordance with a change in the number of oversamples, which is the number of tap factors to be multiplied by said single input data and wherein said input data is multiplied always by the same tap total number of factors in the same order, regardless of the change in the number of oversamples.

* * * * *